United States Patent [19]

Burke, Jr.

[11] 4,353,017

[45] Oct. 5, 1982

[54] VELOCITY COMPENSATION FOR LIMITED DISPLACEMENT MOTORS

[75] Inventor: Edward F. Burke, Jr., Reading, Mass.

[73] Assignee: M.F.E. Corporation, Salem, N.H.

[21] Appl. No.: 746,467

[22] Filed: Dec. 1, 1976

[51] Int. Cl.³ ............................................. G05B 5/01
[52] U.S. Cl. .................................. 318/331; 318/616; 318/617
[58] Field of Search ......................... 318/331, 616, 617

[56] References Cited

U.S. PATENT DOCUMENTS

| | | | |
|---|---|---|---|
| 3,229,182 | 1/1966 | Kubler | 318/331 |
| 3,604,999 | 9/1971 | Pugh | 318/616 |
| 3,660,744 | 5/1972 | Plummer | 318/616 |
| 3,927,360 | 12/1975 | MacMullan | 318/617 |

*Primary Examiner*—B. Dobeck
*Attorney, Agent, or Firm*—Cesari and McKenna

[57] ABSTRACT

A velocity-compensation circuit for a limited-displacement motor comprises a bridge circuit incorporating the control winding of the motor in a first arm. An adjacent bridge arm includes both an inductance and a resistance whose ratio is the same as that of the first bridge arm. The bridge is balanced to eliminate from its output the effect of current through the control winding. The bridge output in normal operation is therefore solely a function of motor velocity and this signal is fed back to provide velocity compensation for the motor.

4 Claims, 1 Drawing Figure

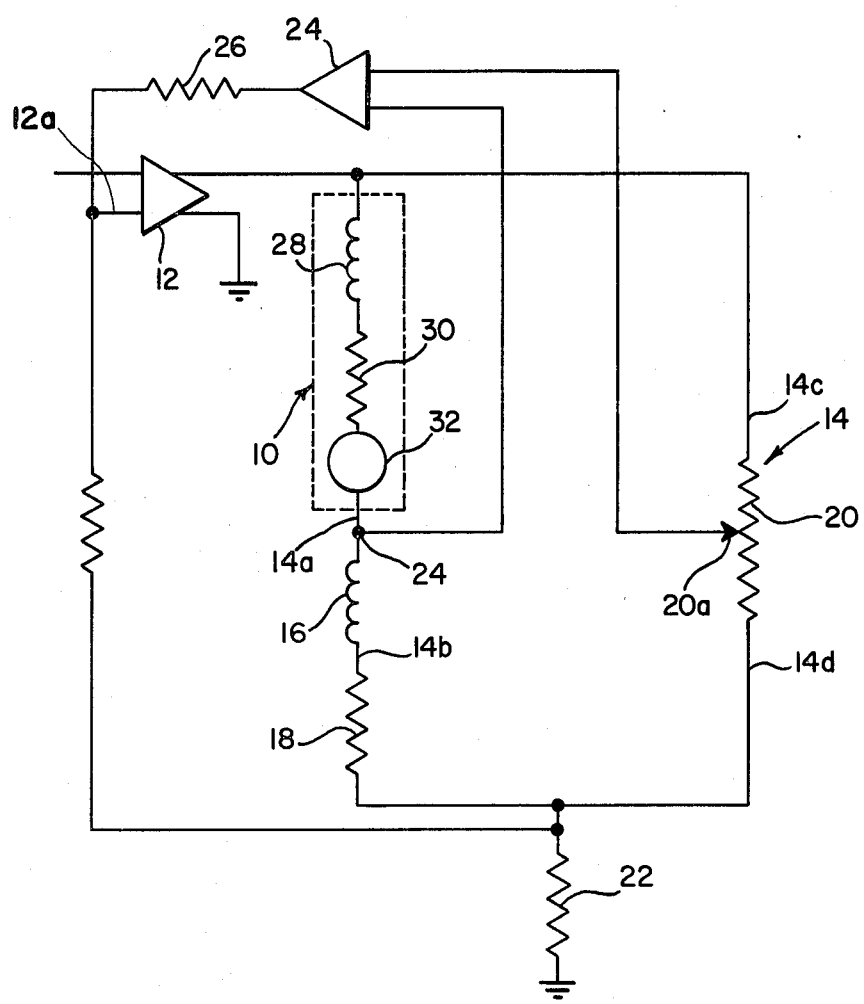

VELOCITY COMPENSATION FOR LIMITED DISPLACEMENT MOTORS

BACKGROUND OF THE INVENTION

A. Field of the Invention

This invention relates to velocity compensation for limited-displacement motors such as those used in galvanometers and like instruments. More specifically, it relates to a velocity-sensing circuit used to provide electronic damping for a limited-displacement motor.

The motors with which the invention is principally concerned are rotational devices used in instrument applications such as galvanometers and pen motors for strip chart recorders. Instruments of this type undergo a limited angular displacement in response to an electrical input. To make the displacement closely correspond with the input signal, the motors are often connected in closed-loop circuits incorporating position feedback. For circuit stability, these circuits often include electronic damping means of velocity feedback. Damping is also desirable in open loop operations to increase the upper frequency limit of the motor and this again requires a signal indicative of the velocity of the motor.

Conventionally, a velocity signal is provided by an electromechanical velocity transducer mechanically coupled to the motor or incorporated therein. A transducer of this type adds materially to the cost of the instrument. In closed-loop systems the velocity signal can be derived by differentiating the output of the position transducer that provides the position feedback signal. However, this often presents noise problems which are handled with difficulty.

A different type of velocity signal is described by M. Kanner, in *Electronic Design, Dec.* 19, 1968, pp. 100-101. The generator, which is used in a speed-control circuit for a continuous-rotation motor, makes use of the fact that the motor itself develops a voltage proportional to velocity. The motor is incorporated in a bridge circuit with three resistors whose values are arranged to balance out the resistance of the motor armature. The unbalance voltage developed by the bridge is then due solely to the velocity-dependent signal generated by the motor. The present invention is directed to a circuit in which a limited-rotation-motor generates the velocity-indicating signal.

SUMMARY OF THE INVENTION

My velocity signal generator comprises a bridge circuit in which one arm includes both resistive and inductive elements so as to balance out both the resistance and inductance in the control winding of the motor. While a limited-rotation motor is a direct-current device in that it requires no commutation, the signals impressed on such a motor often have rapidly changing amplitudes which the motor must follow.

In other words, the signals contain significant AC components and the inductance of the motor winding is therefore a substantial part of the winding impedance. It is necessary to balance out this inductance if the effect of the winding impedance is to be eliminated from the bridge output signal so that the latter is a function solely of motor velocity. This was not appreciated by prior workers such as Kanner, who in the article cited above, states that a bridge circuit containing only resistors can be used to develop a velocity signal useable in positional servo loops and for velocity compensation in open-loop circuits.

BRIEF DESCRIPTION OF THE DRAWING

The drawing is a schematic diagram of an open-loop, velocity-compensated motor circuit embodying the present invention.

As shown in the drawing, a limited-rotation motor shown schematically at 10 is connected to provide an output displacement corresponding to an input signal applied to the terminal 12a of an amplifier 12 which powers the motor. The motor 10 is connected as one arm 14a of a bridge circuit 14. An adjacent arm 14b includes an inductor 16 and a resistor 18. The opposite bridge arms 14c and 14d comprise the respective portions of a potentiometer 20 on the opposite sides of the potentiometer tap 20a.

The bridge circuit 14 is connected in series with a resistor 22 between the output terminals of the amplifier 12. The resistor 22 provides negative current feedback to the amplifier 12 so that the output current of the amplifier corresponds to the input voltage. In this way the displacement of the motor 10, which is proportional to the current through the motor, is made proportional to the input voltage of the amplifier 12.

The output voltage of the bridge, appearing between the potentiometer tap 20a and the junction 24 of the bridge arms 14a and 14b, is fed back to the input of the amplifier 12 by way of an amplifier 24 at a summing resistor 26.

The motor 10 may, by way of example, be a limited-rotation of a type described in U.S. Pat. No. Re. 26,749. That part of the motor in the bridge arm 14a is the control winding of the motor. As schematically shown in the drawing, this winding may be represented by an inductor 28, a resistor 30 and a voltage source 32. The voltage source 32 represents the voltage-generating action of the motor in response to armature velocity, the voltage developed by this source being proportional to the velocity. The bridge circuit 14 is arranged so that the bridge output voltage is a function only of the voltage from the source 32 and thus is independent of the voltage drop across the inductor 28 and resistor 30 resulting from the current supplied by the amplifier 12.

More specifically, the values of the inductor 16 and resistor 18 are chosen so that the inductance-to-resistance ratio in the bridge arm 14b is the same as the corresponding ratio in the bridge arm 14a. The voltages across the arms 14a and 14b are therefore in phase, at all frequencies, with the voltage across the bridge. This means that the bridge can be balanced with the potentiometer 20 by adjusting the tap 20a.

Bridge balance is accomplished by applying an A.C. input signal to the amplifier 12 with the motor 10 armature blocked, so that zero voltage is generated by the source 32. The balance condition of the bridge 14 thus eliminates the effect of motor current from the output of the bridge. Accordingly, during normal operation of the circuit, the bridge output is proportional to the velocity-indicating voltage generated by the source 32. This output voltage is applied by means of the amplifier 24 and resistor 26 in a negative feedback arrangement to provide velocity compensation.

In an open loop arrangement this will tend to linearize the frequency response and extend the frequency range of the motor 10. Alternatively, the depicted circuit can be used in a closed-loop, position-feedback arrangement in which the velocity feedback provides the requisite damping for stability of operation.

Since the resistor 18 is a power dissipating element and, further, since the voltage applied to the motor 10 by the amplifier 12 is reduced in the amount of voltage across the bridge arm 14b, if is desirable that the impedance in the arm 14b be relatively small compared with the impedance with the motor 10, without unduly reducing the amplitude of the velocity-indicating signal. An impedance ratio of 8:1 between the arms 14a and 14b provides satisfactory operation. Thus, with a motor 10 whose control winding exhibits a resistance of 20 ohms and an inductance of 40 millihenries, satisfactory operation will be provided by a bridge arm 14b having a resistor of 2.5 ohms and an inductor 16 of 5 millihenries. The bridge arms 14c and 14d will then have a resistance ratio of 8:1 to balance out the motor impedance.

It is also desirable that the resistance of the potentiometer 20 be substantially greater than the impedance of the bridge arms 14a and 14b so that minimal amplifier current is wasted in the bridge arms 14c and 14b. The upper limit of the potentiometer resistance consonant with sufficient signal output from the bridge 20 depends, of course, on the input resistance of the amplifier 24. For example, the potentiometer 20 might have a resistance of 5,000 ohms with the impedance values given above for the bridge arms 14a and 14b, in which case the amplifier 24 desirably has an input resistance of at least 20,000 ohms.

I claim:

1. A veocity-compensated motor circuit comprising:
    A. a limited-displacement motor having a control winding,
    B. means for supplying a signal for said control winding to effect a mechanical displacement by said motor,
    C. a bridge circuit incorporating
        1. said control winding in a first arm of said bridge circuit, and
        2. means for balancing said bridge circuit to eliminate the effect of current from said signal supplying means on the output of said bridge circuit, whereby the bridge circuit output signal represents the velocity of said motor, said balancing means including a reactance in another arm of said bridge to balance out the reactance of said control winding, and
    D. feedback circuitry for applying the bridge output signal to damp said motor.

2. A velocity-compensated circuit as defined in claim 1 in which
    said balancing means includes an impedance in the second arm of said bridge circuit adjacent to said first arm and having substantially the same reactance/resistance ratio as said first arm.

3. The circuit defined in claim 2 in which said first bridge arm consists of an impedance having inductive and resistive components and said second bridge arm includes an inductor and a resistor.

4. A circuit as defined in claim 2 in which
    A. current from said signal applying means passes in series through said first and second bridge arms, and
    B. the impedance of said control winding is substantially greater than the impedances in series therewith in said first and second arms.

* * * * *